United States Patent
Sone et al.

(10) Patent No.: US 8,450,724 B2
(45) Date of Patent: May 28, 2013

(54) ELECTRICAL DEVICE CONTAINING HELICAL SUBSTITUTED POLYACETYLENE

(75) Inventors: Takeyuki Sone, Tokyo (JP); Akira Kuriyama, Atsugi (JP); Koji Yano, Kawasaki (JP); Otto Albrecht, Atsugi (JP); Masayoshi Tabata, Muroran (JP)

(73) Assignee: Canon Kabushiki Kaisha, Tokyo (JP)

( * ) Notice: Subject to any disclaimer, the term of this patent is extended or adjusted under 35 U.S.C. 154(b) by 612 days.

(21) Appl. No.: 12/294,612

(22) PCT Filed: Sep. 21, 2007

(86) PCT No.: PCT/JP2007/069116
§ 371 (c)(1),
(2), (4) Date: Sep. 25, 2008

(87) PCT Pub. No.: WO2008/047586
PCT Pub. Date: Apr. 24, 2008

(65) Prior Publication Data
US 2009/0179197 A1    Jul. 16, 2009

(30) Foreign Application Priority Data

Sep. 26, 2006 (JP) ................................. 2006-261340
Sep. 26, 2006 (JP) ................................. 2006-261341

(51) Int. Cl.
*H01L 29/06* (2006.01)
*H01L 35/24* (2006.01)
*H01L 51/30* (2006.01)

(52) U.S. Cl.
USPC ................. 257/40; 257/73; 257/75; 977/700; 977/762; 977/765; 977/788; 977/809; 977/720; 977/832; 977/835

(58) Field of Classification Search
USPC ................ 257/40, 73, 75; 977/700, 762, 765, 977/788, 809, 720, 832, 835
See application file for complete search history.

(56) References Cited

U.S. PATENT DOCUMENTS

| | | | |
|---|---|---|---|
| 3,645,999 A * | 2/1972 | Byrd | 525/373 |
| 5,599,589 A | 2/1997 | Albrecht et al. | |
| 6,806,526 B2 * | 10/2004 | Krieger et al. | 257/296 |
| 6,809,955 B2 | 10/2004 | Bulovic et al. | |
| 7,145,793 B1 | 12/2006 | Bulovic et al. | |
| 2003/0071246 A1 * | 4/2003 | Grigorov et al. | 252/500 |

(Continued)

FOREIGN PATENT DOCUMENTS

| | | |
|---|---|---|
| JP | 1108780 A | 4/1989 |
| JP | 2-182708 A | 7/1990 |

(Continued)

OTHER PUBLICATIONS

Kim, Synthetic Metals, 150 (2005) 279-284.*

(Continued)

*Primary Examiner* — Robert C Boyle
(74) *Attorney, Agent, or Firm* — Fitzpatrick, Cella, Harper & Scinto

(57) ABSTRACT

A device is provided by use of a helical substituted polyacetylene. The device comprises a structure comprised of a helical substituted polyacetylene having a helical main chain, and a pair of electrodes for applying a voltage or electric current to the structure, wherein the molecule of the helical substituted polyacetylene has a length larger than the distance between the pair of the electrodes.

6 Claims, 20 Drawing Sheets

U.S. PATENT DOCUMENTS

| | | | |
|---|---|---|---|
| 2004/0241900 A1 | 12/2004 | Tsukamoto et al. | |
| 2004/0248338 A1 | 12/2004 | Sirringhaus et al. | |
| 2004/0253836 A1 | 12/2004 | Sirringhaus et al. | |
| 2004/0256615 A1 | 12/2004 | Sirringhaus et al. | |
| 2004/0263739 A1 | 12/2004 | Sirringhaus et al. | |
| 2008/0220258 A1 | 9/2008 | Sone et al. | |
| 2008/0220283 A1 | 9/2008 | Sone et al. | |

FOREIGN PATENT DOCUMENTS

| | | | |
|---|---|---|---|
| JP | 8001058 A | 1/1996 | |
| JP | 2003142273 A | 5/2003 | |
| JP | 2004027182 A | 1/2004 | |
| JP | 2004075830 A | 3/2004 | |
| JP | 2004115628 A | 4/2004 | |
| JP | 2004-163184 A | 6/2004 | |
| JP | 2004161810 A | 6/2004 | |
| JP | 2005-72569 A | 3/2005 | |
| JP | 2005-520668 A | 7/2005 | |
| JP | 2005-524967 A | 8/2005 | |

OTHER PUBLICATIONS

Tabata, Macromol. Chem. Phys. 200, 265-282 (1999).*

Aleshin, Physical Review Letters, vol. 93, No. 19, p. 199601-1 to 199601-4, 2004.*

M. Kozuka, et al., "Columnar Assemblies of Aliphatic Poly(acetylene ester)s Prepared with a [Rh(norbornadiene)Cl]2 Catalyst. 1H and 13C NMR, X-Ray Diffraction and AFM Studies", Macromol. Chem. Phys., vol. 203, 2002, pp. 66-70.

M. Tabata, et al., "Precise Synthesis of Monosubstituted Polyacetylenes using Rh complex catalysts. Control of solid structure and π-conjugation length", Macromol. Chem. Phys., vol. 200, 1999, pp. 265-282.

O. Albrecht, et al., "Control of the homogeneity of Langmuir-Blodgett Films using the deposition-induced flow in the monolayer", Thin Solid Films, vol. 221, 1992, pp. 276-280.

O. Albrecht, et al., "Construction and use of LB deposition machines for pilot production", Thin Solid Films, vol. 284-285, 1996, pp. 152-156.

PCT International Search Report and Written Opinion of the International Searching Authority, International Application No. 10044143WO01, Mailing Date Apr. 2, 2008.

Kazuo Akagi, "Synthesis of Helical Polyacetylene", Technical Report of the Institute of Electronics, Information and Communication Engineers, OME98-33, 1998, pp. 57-63.

Chinese Office Action dated Apr. 19, 2012 in Chinese Application No. 201110029325.9.

Xu, et al., "Langmuir-Blodgett Films of Regioregular Poly(3-hexylthiophene) as Field-Effect Transistors", Langmuir, vol. 16, 2000, pp. 1834-1841.

* cited by examiner

ELECTRICAL DEVICE CONTAINING HELICAL SUBSTITUTED POLYACETYLENE

TECHNICAL FIELD

The present invention relates to a device employing a helical substituted polyacetylene.

BACKGROUND ART

With progress of integration of electronic circuits, organic devices employing an electroconductive organic substance like an organic semiconductor are attracting attention. The organic devices have advantages of flexibility, a low production cost by processing in a solution, and processability in a larger area.

Organic semiconductors include low molecular organic semiconductors like pentacene, and high-molecular semiconductors like polythiophene. High-molecular semiconductors are attracting attention for use as a large-area low-cost conductive material owing to suitability for solution process. However, the devices employing an organic semiconductor still need improvement in the working speed of the device because of low carrier mobility in comparison with inorganic semiconductors like silicon. The low mobility is caused by retardation of migration of charge carriers caused by defects in bending portions of the molecule and necessity of hopping conduction.

Under such circumstances, helical substituted polyacetylenes are disclosed as electroconductive materials. Japanese Patent Application Laid-Open No. 2004-115628 (Patent Document 1) discloses a polyacetylene having a pseudo-hexagonal and super-helical conjugated structure containing n-electrons of double bonds. This Patent Document 1 describes that the polyacetylenes are useful as a color-changing material, and an electron-supplying material owing to its high conductivity.

Japanese Patent Application Laid-Open No. 2004-027182 (Patent Document 2) discloses a substituted polyacetylene having a helical structure which changes, by application of stimulus, reversibly the density of the helix structure and changes reversibly the light-absorption and light-emission spectrum characteristics. This Patent Document 2 describes that the organic semiconductor constituted of the substituted polyacetylene having variable electroconductivity is applicable as an EL element, a field-effect transistor, and the like.

Patent Documents 1 and 2 suggest the electric conductivity of the helical substituted polyacetylenes, but do not mention specifically an electronic device employing the helical substituted polyacetylene The present invention, provides a novel organic device employing a helical substituted polyacetylene.

DISCLOSURE OF THE INVENTION

The present invention is directed to a device comprising a structure comprised of a helical substituted polyacetylene having a helical main chain, and a pair of electrodes for applying a voltage or electric current to the structure, wherein the molecule of the helical substituted polyacetylene has a length larger than the distance between the pair of the electrodes.

The structure can be comprised of a single molecule of the helical substituted polyacetylene.

The helical substituted polyacetylene can have a non-conjugated functional group in the side chain.

The helical substituted polyacetylene can have a polar substituent group in the side chain.

The device can comprise a controlling electrode.

The molecule of the helical substituted polyacetylene which is longer than the distance between the pair of the electrodes makes unnecessary the hopping conduction between the polyacetylene molecules in electronic conduction between the electrodes. Thereby an organic device is provided in which the electron transfer speed is increased to improve the working speed of the device.

The present invention is also directed to a device comprising a structure comprised of a helical substituted polyacetylene having a helical main chain, and a pair of electrodes for applying a voltage or electric current to the structure, wherein the helical substituted polyacetylene is oriented in the direction connecting the pair of electrodes.

The oriented helical substituted polyacetylene can be placed to bridge the electrodes.

The oriented helical substituted polyacetylene can have an absorption spectrum of a dichroism ratio of 0.1 or more.

The helical substituted polyacetylene can have a substituted or unsubstituted aromatic or heterocyclic ring in the side chain.

In the device, films of the helical substituted polyacetylene can be built up in layers on a substrate.

The oriented helical substituted polyacetylene can be formed by transferring molecules developed on a water surface onto a substrate.

The orientation of the film enables higher electric conductivity in a certain direction of the prepared conductive film than that of non-oriented film. This improves the function of the helical substituted polyacetylene molecule as the electroconductive molecular wire between the electrodes. Thereby the present invention provides an organic device improved in the working speed.

The present invention provides a novel organic device which is improved in working speed.

Further features of the present invention will become apparent from the following description of exemplary embodiments with reference to the attached drawings.

BRIEF DESCRIPTION OF THE DRAWINGS

FIG. 19A is a plan view of a water tank, FIG. 19B is a side view thereof, and FIG. 19C illustrates a substrate with electrodes on which a film is formed.

BEST MODE FOR CARRYING OUT THE INVENTION

Figure 1:
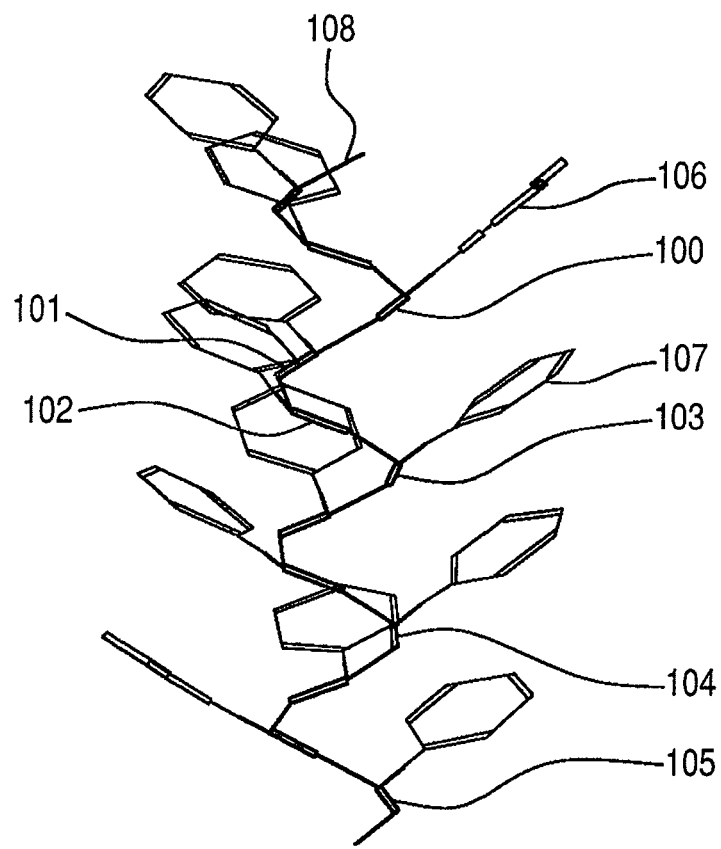
FIG. 1 illustrates a structure of a helical substituted polyacetylene of the present invention.
Figure 1:
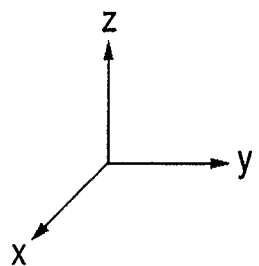

The present invention is described below in more detail.

The device of the present invention comprises a structure constituted of a helical substituted polyacetylene having a helical main chain and a pair of separated electrodes for applying a voltage or electric current to the helical substituted polyacetylene. In particular, the device is characterized in that the molecule of the helical substituted polyacetylene has a length larger than the distance between the pair of electrodes.

The device of the present invention includes those comprising a polymer composed of a helical substituted polyacetylene which has average length of the molecule larger than the distance between the pair of electrodes.

The device of the present invention includes those comprising a single-molecular helical substituted polyacetylene in which the length of the single molecule of the helical substituted polyacetylene is larger than the distance between the pair of electrodes.

The device of the present invention includes those comprising a helical substituted polyacetylene having a non-conjugate functional group in the side chain.

The device of the present invention includes those comprising a helical substituted polyacetylene having a polar substituent in the side chain.

The device of the present invention includes those having a pair of electrodes and additionally a controlling electrode.

The helical substituted polyacetylenes are promising as a next-generation conjugated polymer different from usual non-helical substituted polyacetylene, owing to the stereo-regular structure, helical structure and self-organizing structure thereof.

The helical substituted polyacetylene has the main chain of the primary structure having alternate double bonds which is the same as that of a non-helical substituted polyacetylene. However, the helical substituted polyacetylene which has substituents larger than the hydrogen atom cannot have a planar structure but is twisted sterically.

In the present invention, the oriented film constituted of a structure of a helical substituted polyacetylene has a high electroconductivity in the axis direction as a conductive molecular wire, and a high solubility in a solvent. An oriented conductive film having a high conductivity in one direction only can be produced readily by orienting the film in one direction. This can improve the bottom-up technique remarkably. The helical substituted polyacetylene molecule of the present invention is relatively rigid in a bar shape, being capable of forming readily a regular arrangement structure, so that the helical substituted polyacetylene can be highly oriented readily in a simple manner.

The solubility of the helical substituted polyacetylene can be controlled by selecting the side chain structure. Therefore the helical substituted polyacetylene can be used as a soluble electroconductive high polymer material. The helix structure is in a shape of a rigid bar since the structure is constituted of alternate double bonds of the polyacetylene as the main chain. Therefore the helical structure is useful as an electroconductive molecular wire. The helical substituted polyacetylene can be used in a single molecule state, or in a bulk structure like a bundle or a thin film containing plural molecules. The substituted polyacetylenes are promising as next-generation conjugated high polymers owing to the stereo-regular structure, helical structure, and self-organizing structure, being different from known unsubstituted polyacetylenes.

Figure 2:
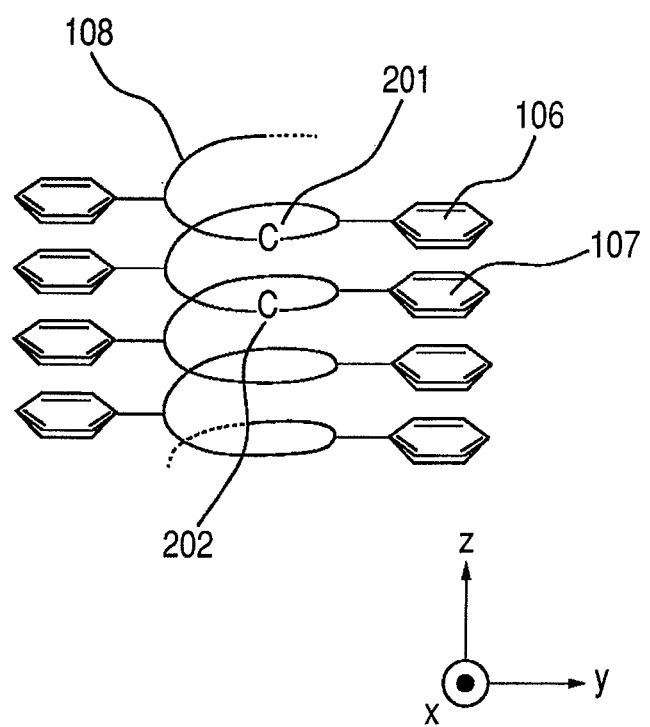
FIG. 2 illustrates another structure of a helical substituted polyacetylene of the present invention.
Figure 3:
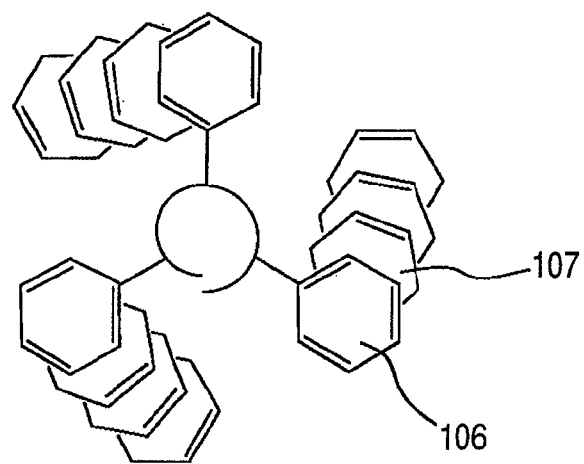
FIG. 3 illustrates still another structure of a helical substituted polyacetylene of the present invention.
Figure 3:
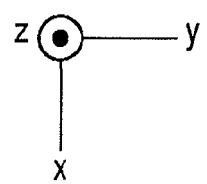

FIGS. 1 to 3 illustrate the helical substituted polyacetylene used in the present invention. In FIG. 1, main chain 108 has a helix structure with the alternate double bonds twisted. The helix structure is approximate to a 3/1 helix in which three double bonds, namely double bond 100, double bond 101, and double bond 102, make nearly one turn of the helix (Macromol. Chem. Phys., 203, pp. 66-70 (2002)). In this structure, double bond 100 and double bond 103 after one turn are placed nearly parallel at an interval of 5 Å or less, typically from 2 Å to 4 Å. Similarly, double bond 103 and double bond 104, and double bond 104 and double bond 105 are respectively placed parallel at the interval of the helix pitch. In FIG. 1, the numerals 106 and 107 denote respectively an aromatic ring. In FIG. 2, for ease of understanding, main chain 108 including double bonds 100 to 105 is illustrated by a spiral. Further in FIG. 2, for simplicity, two side chains are shown to bond to the main chain in each turn of the helix. However, actually, three side chains are bonded in nearly one turn of the helix as shown in FIG. 1. In FIG. 2, the two carbon atoms 201 and 202 are in main chain 108 at an interval of approximately one turn of the helix, and stacked in the z direction in the drawing. FIG. 3 illustrates schematically a helical substituted polyacetylene of the present invention viewed in the z direction. Further, the helical substituted polyacetylene in the present invention has the above helical structure over a long distance, typically from 5 nm to 10 μm, in which the entire molecule is in a straight bar shape in the z direction in the drawing.

Generally, stereoregular polyacetylene molecules are known to form a helix structure. However, the regular helix structure does not extend long. The helical substituted polyacetylene employed in the device structure of the present invention has a cycle period to cause overlapping of π-electron orbitals, specifically 5 Å or less, typically the pitch ranging from 2 Å to 4 Å, and has a long helix structure, the length ranging typically from 5 nm to 10 μm.

Generally, in the electronic device, an electric current is applied through electrodes placed at the both ends of the element, like a source and a drain or an emitter and a collector as in a field effect transistor (FET) and a bipolar transistor. In an EL element, an electric current is applied to a light-emitting active layer from outside through electrodes. Like this, the electronic device is basically constituted of electrodes and an electroconductive medium between the electrodes. The helical substituted polyacetylene in the present invention, which has a rigid straight structure, enables improvement in the working speed of the electronic device by employing this helical substituted polyacetylene as the electroconductive medium between the electrodes.

In the device structure of the present invention, in the electric conduction between the electrodes, intermolecular hopping conduction can be prevented by use of a helical substituted polyacetylene having a length of not smaller than the interelectrode distance, whereby the time for transfer of the charge carriers between the electrodes is shortened to increase the working speed of the device further.

Further, a higher-speed organic functional element can be realized by providing a controlling electrode to modulate the function in the molecule of the helical substituted polyacetylene. For example, a higher-speed transistor element for switching or amplification can be realized by modifying the carrier concentration, the band structure, the carrier speed, and so forth in the substituted polyacetylene.

The solubility of the helical substituted polyacetylene of the present invention can be adjusted by selecting the side chain structure. The helical substituted polyacetylene in the present invention may be used in a state of a single molecule, in a bundle of plural molecules, or in a bulk structure like a crystal.

A so-called monomolecular electronic device which employs a single molecular chain can be realized with a structure having only one molecule between the electrodes. The monomolecular device which works with one molecule, has a small device area, consumes less power, and causes less variation in the properties among the devices.

The length of the helical substituted polyacetylene signifies the average length of the helical substituted polyacetylene molecules when the polyacetylene is constituted of an assemblage of molecules, or a length of the single molecule when the polyacetylene is single-molecular. The length of the molecule of the helical substituted polyacetylene can be measured by AFM (atomic force microscopy). The length is larger than the distance between a pair of the electrodes, ranging, for example, from 10 nm to 10 µm.

In the helical substituted polyacetylene in the present invention, the aromatic ring is not essential in the side chain. However, in the aromatic-ring-substituted polyacetylene, as shown in FIGS. 1 to 3, aromatic ring 106 and aromatic ring 107 are juxtaposed at the interval of the helix pitch. Similarly, other aromatic rings are juxtaposed at the interval of the helix pitch in the z direction (main chain direction), whereby the electroconductivity is increased. The same effect can be achieved by use of heteroaromatic rings containing nitrogen, oxygen, or sulfur in place of the aromatic rings.

The helical substituted polyacetylene in the present invention is described below in more detail. The helical substituted polyacetylene has the structure represented by Formula 1 below:

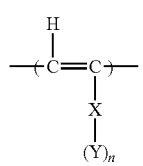

(1)

In Formula 1, the symbols X and Y denote respectively a substituent including chain or ring hydrocarbon groups and functional groups which may have a heteroatom, or a metal atom; and the symbol n denotes the number of the functional groups substituting the hydrogen of the group X, ranging from 1 to 20.

In the above Formula 1, the group X includes substituted or unsubstituted aromatic or heteroaromatic rings; linkages of carbonyl, ester, ether, carbonate, amido, imino, urethane, phosphoric acid, and thioether; groups of sulfinyl, sulfonyl, amino, and silyl; alkylene oxide chains of any chain length; and other ring or chain hydrocarbons.

The group X may have one substituent Y or the same or different plural substituents Y.

The group X includes specifically groups of phenyl, thienyl, biphenyl, naphthyl, anthryl, fluorenyl, carbazolyl, and cyclohexyl; linkages of carbonyl, ester, ether, carbonate, amido, imino, urethane, phosphoric acid, thioether, sulfinyl, sulfonyl, amino, silyl, and amino; and chains of ethylene oxide, trimethylene oxide, triethylene oxide, hexamethylene oxide, tetraethylene oxide, methylene, ethylene, and hexamethylene.

The group Y includes substituents of halogen, hydroxyl, carboxyl, nitro, cyano, vinyl, and ethynyl in addition to the above chemical species shown as X. The group Y may further have the similar chemical species.

The group Y includes, in addition to the above, specifically groups of methyl, ethyl, n-propyl, isopropyl, n-butyl, s-butyl, t-butyl, 2-methylbutyl, n-pentyl, neopentyl, n-hexyl, cyclohexyl, 4-methylcyclohexyl, 2-ethylhexyl, n-heptyl, n-octyl, n-decyl, n-dodecyl, n-tetradecyl, fluoro, chloro, bromo, iodo, methoxy, ethoxy, n-propoxy, isopropoxy, n-butoxy, s-butoxy, t-butoxy, n-pentyloxy, neopentyloxy, n-hexyloxy, 2-ethylhexyloxy, cyclohexyloxy, n-octyloxy, n-decyloxy, n-dodecyloxy, n-tetradecyloxy, methyltrimethylene oxido, methylhexamethylene oxido, ethyltetraethylene oxido, methyl sulfido, octyl sulfido, phenyldithiol, cyclohexyl, methyl ester, ethyl ester, butyl ester, acethyl, methylsulfoxido, dimethylamino, acetamido, trimethylsilyl, trimethoxysilyl, dimethyloctylsilyl, nitro, cyano, vinyl, and ethynyl.

The helical substituted polyacetylene has a number-average polymerization degree ranging from 50 to 100000.

The helical substituted polyacetylene can be synthesized by polymerizing an acetylene compound represented by Formula 1A below with a transition metal complex as the catalyst.

where the symbols X and Y denote respectively a substituent including chain- or ring-hydrocarbon groups and functional groups which may have a heteroatom, or a metal atom; and the symbol n denotes the number of the functional groups substituting the hydrogen of the group X, ranging from 1 to 20.

The transition metal complex includes rhodium compounds such as rhodium(norbornadiene) chloride dimer ([Rh(NBD)Cl]$_2$), and rhodium(cyclooctadiene) chloride dimer ([Rh(COD)Cl]$_2$). Of these, [Rh(NBD)Cl]$_2$ is preferred (Macromol. Chem. Phys., 200, 265-282 (1999)). A cocatalyst such as amines, lithium compounds, and phosphorus compounds may be employed. Of these, triethylamine is particularly preferred. Not only the dimers of the rhodium complex, but also a monomer such as Rh[C(C$_6$H$_5$)=C(C$_6$H$_5$)$_2$] (NBD) ((C$_6$H$_5$)$_3$P) is useful.

The solvent for the polymerization reaction includes nonpolar solvents such as chloroform, tetrahydrofuran, and toluene; and polar solvents such as ethanol, triethylamine, dimethylformamide, and water. Of these solvent, chloroform, toluene, ethanol, and triethylamine are preferred. The solvent may be used singly or in combination of two or more thereof.

The higher-order structure of the helical substituted polyacetylene is exemplified by a structure of a bulk or a thin film. The helical substituted polyacetylene in the present invention should have the helix pitch kept fixed over a long distance within the molecule, but an assemblage structure is not essential.

In formation of the basic device structure of the present invention, the helical substituted polyacetylene is dissolved in an organic solvent like chloroform and toluene at a concentration ranging approximately from $1.0 \times 10^{-4}$ wt % to $2.0 \times 10^{-2}$ wt %, and is applied, for example, on metal electrodes patterned on a silicon substrate.

Figure 4:
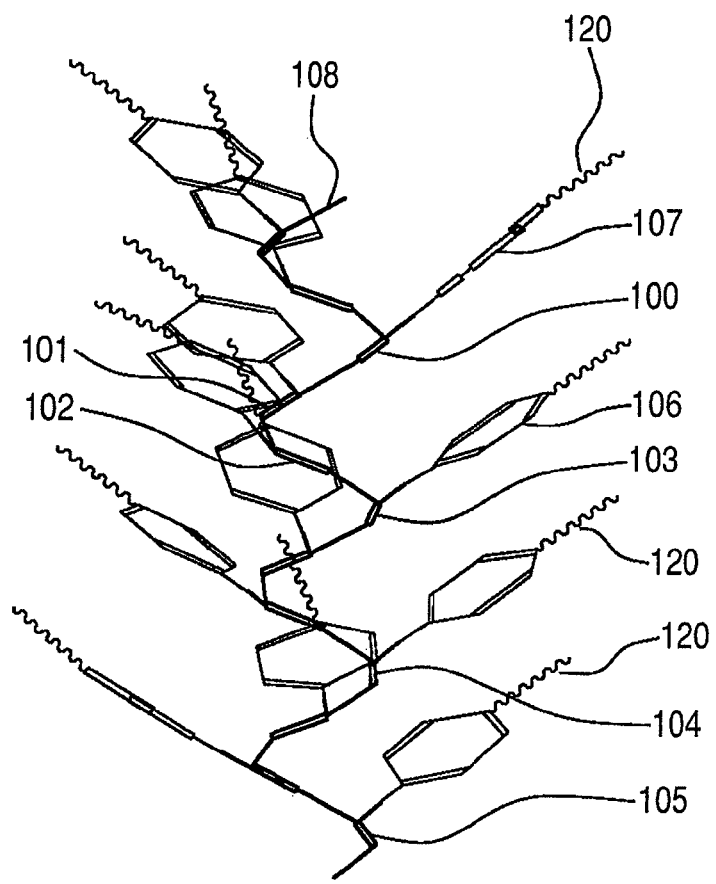
FIG. 4 illustrates still another structure of a helical substituted polyacetylene of the present invention.
Figure 4:
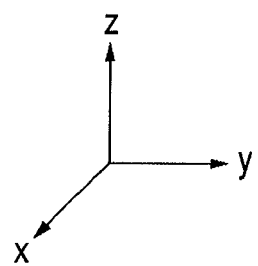
Figure 5:
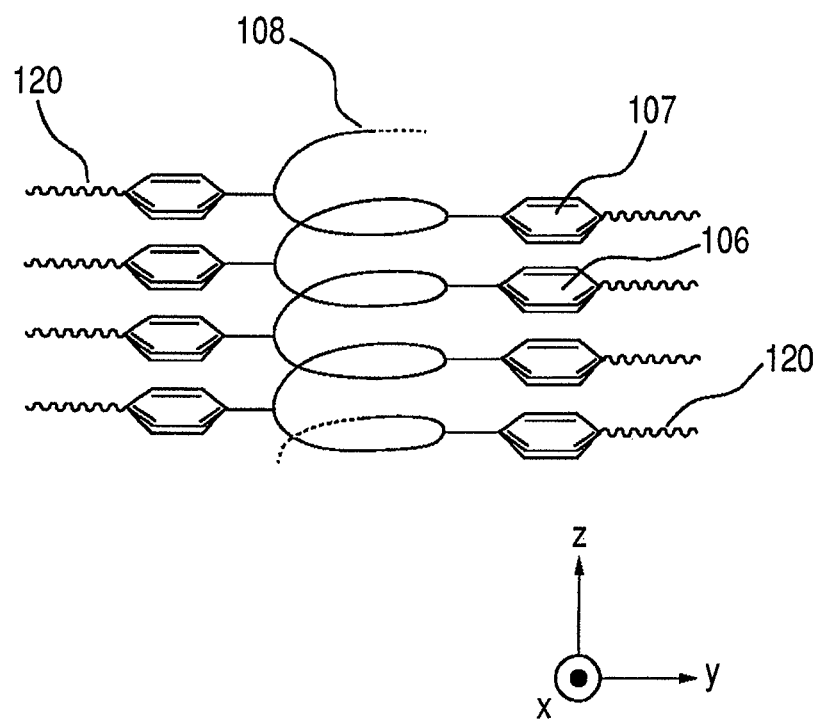
FIG. 5 illustrates still another structure of a helical substituted polyacetylene of the present invention.
Figure 6:
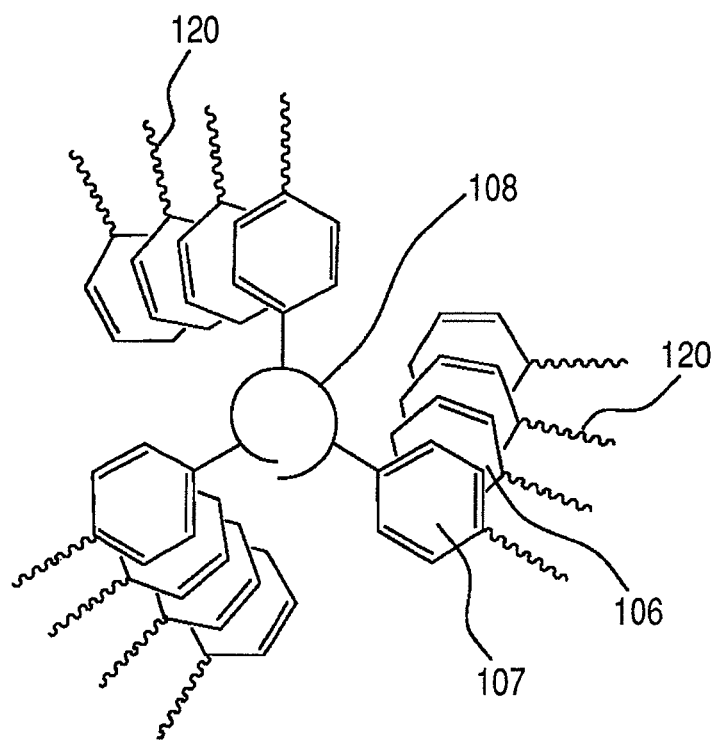
FIG. 6 illustrates still another structure of a helical substituted polyacetylene of the present invention.
Figure 6:
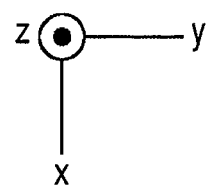

Other helical substituted polyacetylenes are described in which the basic skeleton is not changed from those illustrated in FIGS. 1 to 3 but the side chains are changed, with reference to FIGS. 4 to 9. The polyacetylenes illustrated in FIGS. 4 to 6 are different from those illustrated in FIGS. 1 to 3 in that the side chains have non-conjugated functional group 120. In these drawings, the same numerals are used for denoting the corresponding moieties as in FIGS. 1 to 3. The polyacetylene illustrated in FIGS. 4 to 6 has non-conjugated functional groups (e.g., alkyl group, and halogen atom) 120, whereby the acetylene units can be arranged inside straightly with insulating moieties placed outside.

The polyacetylene illustrated in FIG. 5 or FIG. 6 has non-conjugated functional groups 120 as the outside shell of the helical molecule. The non-conjugate functional groups are insulating. Thereby, a coated electroconductive molecular wire is formed with the insulating outside shell and the inside electroconductive portion.

The non-conjugated functional groups are introduced in any positions of the side chains of the polyacetylene. Specifically, the non-conjugated functional group is contained in the group Y in the above Formula 1. In the case where the group X has plural different kind of Y groups, at least one of the Y groups is a non-conjugated functional group.

The non-conjugated functional group includes alkyl groups, halogenated alkyl groups, halogens, methylene chains, alkylene oxide chains, substituted or unsubstituted cycloalkyl groups, and non-conjugated heterocycles.

Specifically, the non-conjugated functional group includes groups of methyl, ethyl, propyl, n-butyl, s-butyl, t-butyl, 2-methylbutyl, n-pentyl, n-hexyl, 2-ethylhexyl, n-heptyl, n-octyl, n-decyl, n-dodecyl, and n-tetradecyl; a hexamethylene chain; a pentafluoroethyl group; halogens of fluoro, chloro, bromo, and iodo; chains of trioxymethylene, hexaoxymethylene, and tetraoxyethylene; and a cyclohexyl group.

Figure 7:
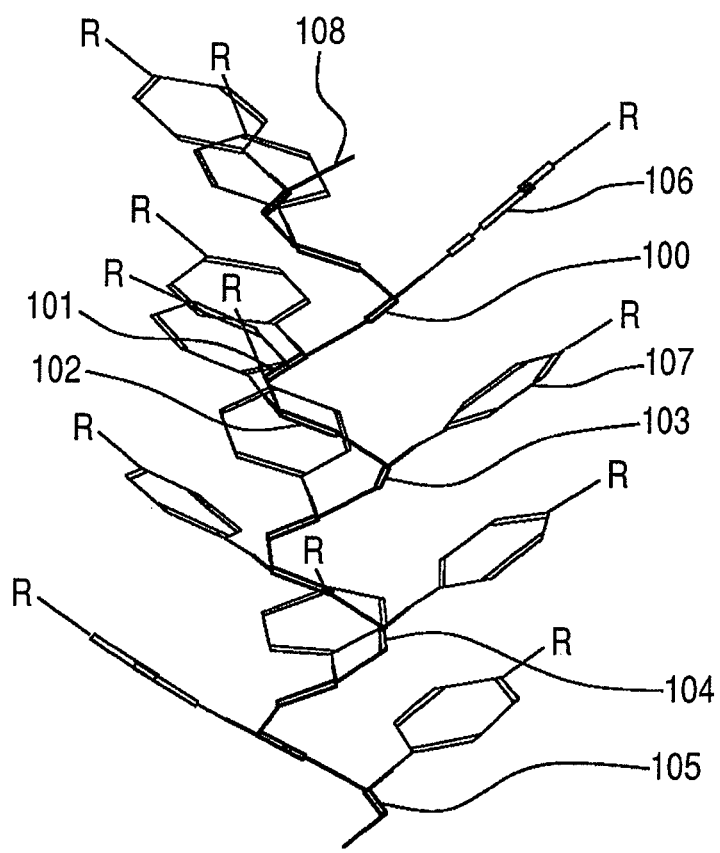
FIG. 7 illustrates still another structure of a helical substituted polyacetylene of the present invention.
Figure 7:
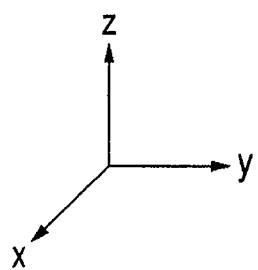
Figure 8:
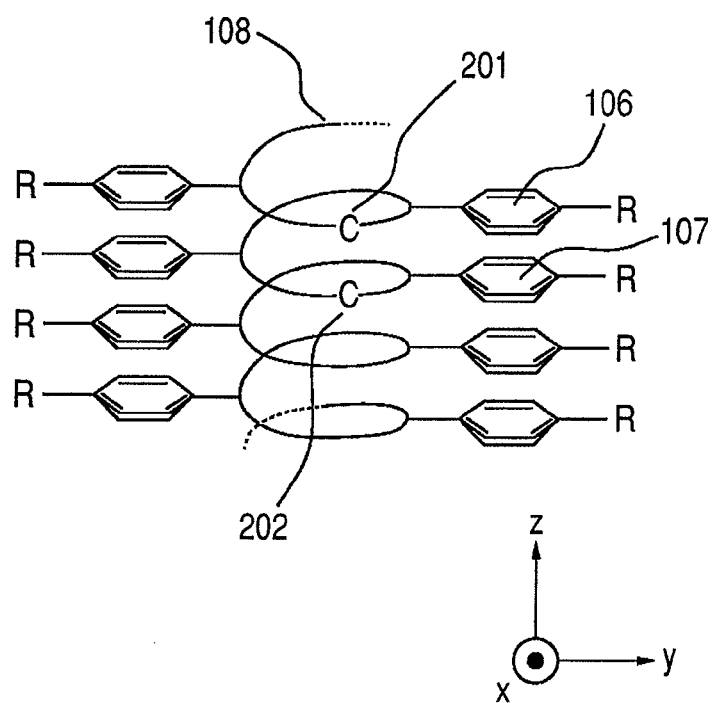
FIG. 8 illustrates still another structure of a helical substituted polyacetylene of the present invention.
Figure 9:
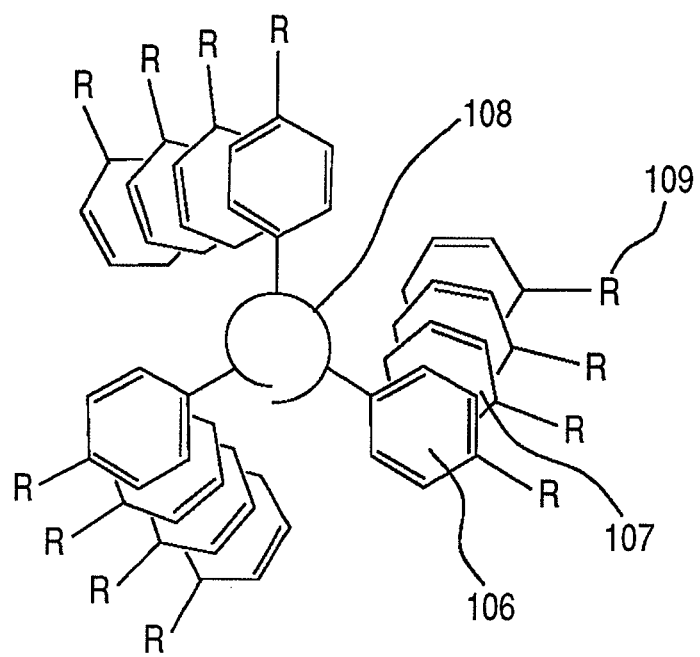
FIG. 9 illustrates still another structure of a helical substituted polyacetylene of the present invention.

Next, the polyacetylene having polar substituents on the side chain is described with reference to FIGS. 7 to 9. The polyacetylene described here is different from those described above in the presence of polar groups R on the side chains in place of the non-conjugated functional group. In these drawings, the same numerals are used for denoting the corresponding moieties as in the drawings shown before. The polar groups (e.g., nitro, and cyano) in the side chains of the polyacetylene causes dipole-dipole interaction or electrostatic interaction such as hydrogen bonding between the neighboring side chains in the helix to improve the rigidity and stability of the helix structure. This interaction decreases defects in the helix structure and enlarge the range of the conjugation to improve the electroconductivity. Further, in the helical substituted polyacetylene having polar functional groups, the polar functional groups R are juxtaposed at intervals of the helix pitch as illustrated in FIG. 7. Similarly, the other functional groups are also juxtaposed at intervals of the helix pitch in the main chain direction. Thereby, in this structure, the dipoles of the polar functional groups cause electrostatic interaction between the side chains in the helix. Thus the presence of the polar functional group improves the rigidity and stability of the helix structure and also controls the helix pitch distance. In the case where the helical substituted polyacetylene has hydrogen-bonding functional groups (e.g., amide group) capable of forming hydrogen bonding, the hydrogen-bonding functional groups R comes to be juxtaposed at intervals of the helix pitch and the other functional group also comes to be juxtaposed in the main chain direction. Therefore, in this structure, the hydrogen-bonding functional groups form hydrogen bonds between the adjacent side chains in the helix pitch. The polar groups may be contained in any of the group X and the group Y, or may be contained in both of the group X and group Y. When the group X has plural different Y groups as the substituents, any of the substituents Y may contain the polar functional group. The polar functional group includes groups of halogen, nitro, and cyano; linkage of carbonyl, ester, carbonate, amido, imino, urethane, and phosphoric acid; and groups of sulfinyl, sulfonyl, and amino.

The construction of the device is described below schematically with reference to drawings.

Figure 10:
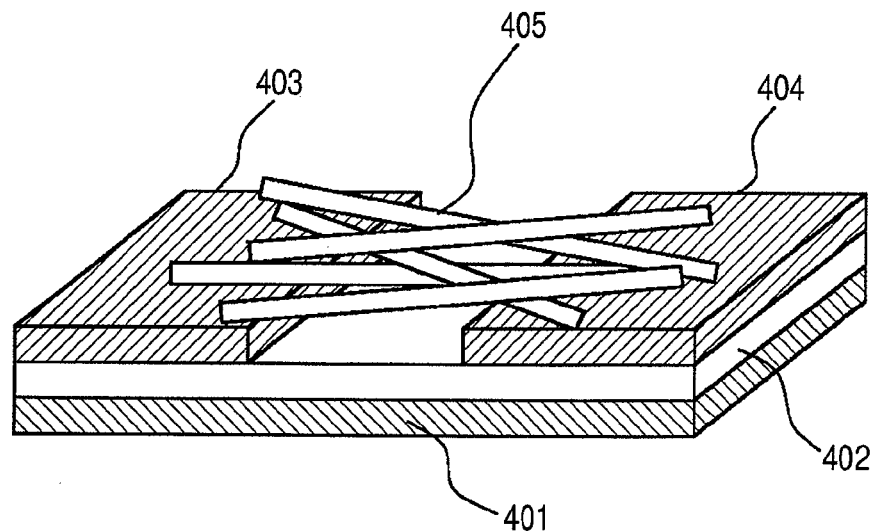
FIG. 10 illustrates schematically an embodiment of a structure of an organic device of the present invention.

FIG. 10 is a schematic drawing of an example of the organic device of the present invention. Substrate 401 which is made of a electroconductive material like high-doped silicon can be used also as a controlling electrode for applying a voltage to the helical substituted polyacetylene. Insulating film 402 insulates helical substituted polyacetylene 405 from substrate 401 as the controlling electrode. Electrodes 403,404 serve to apply a voltage or electric current to helical substituted polyacetylene 405. In the present invention, the length of the molecule of helical substituted polyacetylene 405 is larger than the distance between electrodes 403,404, whereby intermolecular hopping of electrons is prevented between electrodes 403,404, and the movement velocity of carriers between electrodes 403,404 is increased to improve the working speed of the device. In FIG. 10, the length of helical substituted polyacetylene 405 may be the same as the distance between electrodes 403,404, where helical substituted polyacetylene 405 is placed with each of the ends thereof to be in contact with electrodes 403 and 404. Further, the controlling electrode provided modulates the function of the helical substituted polyacetylene to increase the speed of the element function. For example, modification of the carrier concentration, the band structure, the carrier speed, and so forth enables production of high-speed transistor elements for switching or amplification. Various functions of an organic device can be realized by employing a suitable substituent as the side chain of the helical substituted polyacetylene.

Figure 11:
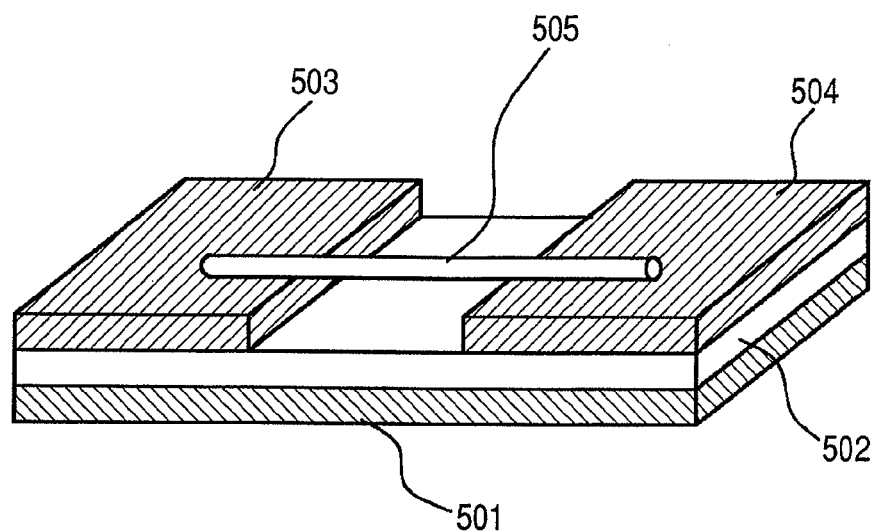
FIG. 11 illustrates schematically another embodiment of a structure of an organic device of the present invention.

FIG. 11 illustrates a device structure having only one molecule of helical substituted polyacetylene 505 placed between the electrodes. The device illustrated in FIG. 11 is different from the one in FIG. 10 in that only one molecule of helical substituted polyacetylene 505 is placed to bridge the electrodes. In consideration of the power consumption of the device, the number of the molecules between the electrodes is preferably less. Use of one molecule decreases ultimately the power consumption and decreases the variation of properties among the elements.

The film of a uniaxially oriented helical substituted polyacetylene is described below.

The above helical substituted polyacetylene as the electroconductive material may be in a state of a molecule assemblage such as a thin film and a monomolecular film, other than the above-described single molecular wire. However, the electroconductivity of the molecule assemblage is not so high from that expected from the high electroconductivity of the molecular wire of a single molecule. In the state of a film longer than one molecule, the electric connection between the molecules depends naturally on electron hopping. Therefore, in the non-oriented film in which the molecules are dispersed at random, the electrons are transferred between the molecules many times to transfer the charges, resulting in a low electroconductivity in a film state, although each of the single molecules has high electroconductivity.

A film in which at least a part of the molecules of the helical substituted polyacetylene is uniaxially oriented can have an improved electroconductivity and can serve simultaneously as an assemblage of the electroconductive molecular wires. For this purpose, the helical substituted polyacetylene molecule which is rigid and bar-shaped as described above, can be synthesized in a length of the molecule of several micronmeters by controlling the polymerization degree, and can readily be arranged in a regular oriented structure. Therefore, the helical substituted polyacetylene can be formed in a highly oriented film by a relatively simple process.

The method of orientation of the molecules for the above purpose is not specially limited. In one method, for example, the helical substituted polyacetylene molecules are developed on the surface of water, and are transferred onto a substrate.

A process for preparation of an oriented film by transfer of a film developed on a water surface onto a substrate is described below. The orientation film is formed by application of a process for forming an amphiphilic polymer lamination film, generally called a "Langmuir-Blodgett film" (hereinafter referred to as "LB film").

Figure 19A:
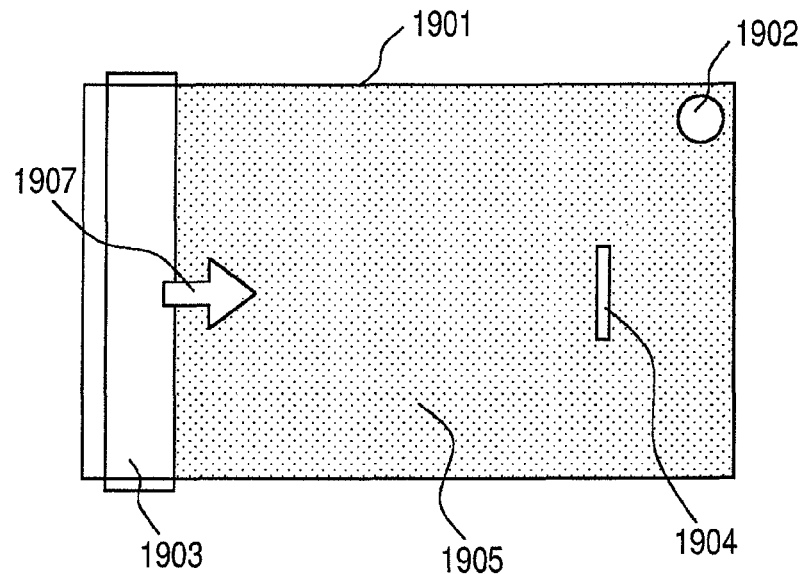
FIGS. 19A, 19B, and 19C illustrate an LB film-forming apparatus.
Figure 19B:
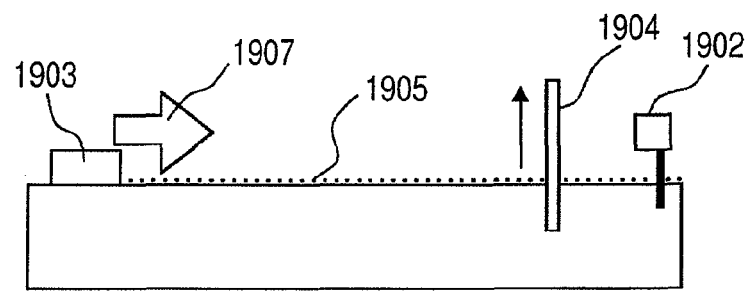
Figure 19C:
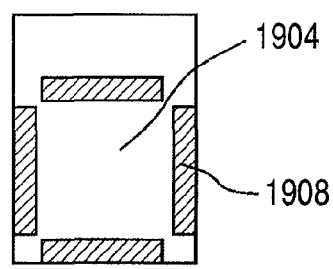

FIG. 19A is a plan view of a water tank, FIG. 19B is a side view thereof, and FIG. 19C illustrates a substrate with electrodes on which a film is laminated. Water tank 1901 is filled with pure water like distilled water. The size of water tank 1901 is preferably smaller for the higher orientation degree of the oriented film, but is selected in consideration of the size of the substrate to be inserted therein. The common technique for the LB built-up film formation is described by the inventors of the present invention, for example, in "Thin Solid Films" 221 (1992) 276, and "Thin Solid Films" 284 (1996) 152.

Firstly, a solution of helical substituted polyacetylene is dropped onto the clean surface of the water in the water tank 1901. The solvent is not limited, insofar as it evaporates quickly, being capable of dissolving the helical substituted polyacetylene, and being hydrophobic. Chloroform is preferably used as the solvent. The amount of the chloroform and the concentration of the helical substituted polyacetylene is determined so that the helical substituted polyacetylene may develop in a monomolecular film state on the water surface. To the hydrophobic solvent, an amphiphilic solvent like an alcohol may be added in an amount of 2-4 wt % to increase the speed of spreading of the film to shorten the time of the film formation.

Then, movable barrier 1903 is moved by monitoring the film pressure with film pressure gauge 1902 to form a monomolecular film developed on the water surface. In FIG. 4, only one movable barrier 1903 is employed at one end of water tank 1901, but two movable barriers may be provided at the both ends of the water tank to adjust more precisely the film pressure and orientation of the water-surface-developed film.

The monomolecular developed film formed as above on the water surface is transferred in lamination onto the surface of substrate 1904 by moving vertically substrate 1904 in reciprocation. The material of substrate 1904 may be a glass plate or a plastic plate, but is not limited thereto, insofar as the helical substituted polyacetylene molecules can adhere thereto. The substrate may have electrodes formed preliminarily thereon. With progress of the film transfer, the amount of the film developed on the water surface can decrease. Therefore movable barrier 1903 should be moved in the direction of arrow mark 1907 to keep constant the film pressure by monitoring with pressure gauge 1902 not to disrupt the orientation of the developed film. The position of moving barrier 1903 may be controlled automatically in accordance with the indication of pressure gauge 1902.

On the surface of substrate 1904, the molecular film will be laminated in the number of layers as the number of times of pull-up and draw-down of the substrate. Therefore, for formation of a multi-layered film, substrate 1904 is pulled up and drawn down in necessary times of repetition. When the developed film on the water surface has become insufficient, the vertical movement of substrate 1904 is stopped, and the solution of helical substituted polyacetylene is dropped on the water surface.

The film developed on the water surface may be not sufficiently oriented at the beginning, and several layers after the start of the film transfer can be less oriented. In such a case, the orientation of the developed film can be improved by the flow of the water caused by movement of movable barrier 1903 and substrate 1904, and after vertical reciprocating movement of the substrate five to ten times, the orientation of the transferred lamination film on the substrate can be improved and stabilized. Therefore for transfer of one or more layers of the highly oriented films, about ten layers of the orientation film are transferred preliminarily on the a substrate and are peeled, and thereon the intended film layer is transferred, or about ten layers thereof are transferred on a dummy substrate and the film is transferred on a new substrate.

In the above-mentioned process of formation of an orientation film, a multi-layered film is built up in a batch operation in a water tank without a flow of the water. Otherwise, the film may be formed continuously on a flowing water surface in a water tank. In this continuous process, the first layer formed can be highly oriented. Japanese Patent Application Laid-Open No. H08-001058 discloses the continuous film-forming apparatus. The disclosed apparatus is useful also in the present invention.

Generally, in the electronic device, an electric current is applied through electrodes placed at the both ends of the element, like a source and a drain or an emitter and a collector as in a field effect transistor (FET) or a bipolar transistor. Also in an EL element, an electric current is applied to a light-emitting active layer from outside through electrodes. Like this, the electronic device is basically constituted of electrodes and an electroconductive medium between the electrodes.

The oriented helical substituted polyacetylene as the electroconductive medium between the electrodes enables increase of the working speed of the device.

Further, a higher-speed organic functional element can be realized by providing a controlling electrode to modulate the function in the molecule of the helical substituted polyacetylene. For example, a higher-speed transistor element for switching or amplification can be attained by modifying the carrier concentration, the band structure, the carrier speed, and so forth in the substituted polyacetylene.

Figure 20:
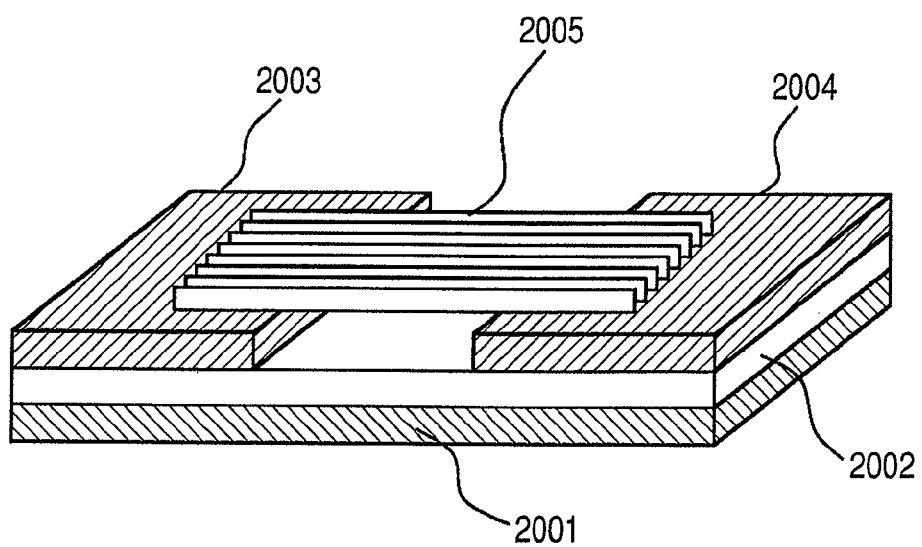
FIG. 20 illustrates an organic device of the present invention.

FIG. 20 illustrates an organic device of the present invention. Substrate 2001 which is made of an electroconductive material like high-doped silicon can be used as a controlling electrode for applying a voltage to oriented helical substituted polyacetylene film 2005. In FIG. 20, oriented film 2005 is constituted of the molecular chains arranged in the z-direction in FIG. 2 and is placed to connect electrodes 2003 and 2004 with the molecular chains. Insulating film 2002 insulates helical substituted polyacetylene 2005 from the controlling electrode (substrate 2001). Electrodes 2003, 2004 apply a voltage or an electric current to oriented helical substituted polyacetylene 2005.

The structure illustrated in FIG. 20 is similar to that of a conventional field-effect transistor. However, the device of the present invention employs oriented helical substituted polyacetylene film 2005 in the region between electrode 2003 and electrode 2004. Thereby, in this device, carriers move at a higher speed between electrodes 2003, 2004 to increase the working speed of the device.

Helical substituted polyacetylene film 2005 which is oriented partially, not entirely, can achieve a certain effect. However, an oriented portion of the molecule bridging between electrode 2003 and electrode 2004 improves more the working speed of the device. Naturally, oriented helical substituted polyacetylene film 2005 is preferably oriented completely.

EXAMPLES

The present invention is described specifically with reference to examples.

Example 1

In this Example, an organic device was produced with poly(p-octyloxyphenylacetylene).
(Synthesis of Monomer)

In 50 mL of dimethyl sulfoxide, were dissolved 11.0 g (50 mmol) of iodophenol and 6.0 g (150 mmol) of sodium hydroxide. Thereto 9.7 g (50 mmol) n-octyl bromide was added to cause a reaction. The reaction was allowed to proceed at room temperature for 4 hours. The reaction product was extracted with 200 mL of chloroform. The chloroform layer was washed with distilled water, and was dried over anhydrous magnesium sulfate. The chloroform was distilled off to obtain Product-A. The obtained Product-A was purified by silica gel column chromatography (solvent: hexane). Product-A was isolated at a yield of 99%.

A portion of 16.6 g (50 mmol) of the above Product-A was dissolved in 250 mL of triethylamine. Thereto were added 350 mg of dichloro-bis(triphenylphosphine)palladium (II), 2.4 g of copper iodide, 650 mg of triphenylphosphine, and 7.0 g of tetra(t-butyl)ammonium chloride. Thereto, 10.5 g (125 mmol) of 3-methyl-1-butyn-3-ol was added dropwise, and the mixture was allowed to react by heating under reflux for 4 hours. The solvent was distilled off by an evaporator. The product was extracted with 200 mL of chloroform. The chloroform layer was washed with dilute hydrochloric acid and distilled water, and dried over anhydrous magnesium sulfate. The chloroform was evaporated off to obtain Product-B. The obtained Product-B was purified by silica-gel column chromatography (solvent: chloroform). Product-B was isolated at a yield of 90%.

A portion of 9.0 g (31 mmol) of the obtained Product-B was added to a mixture of 100 mL of ethanol and 4.4 g (78 mmol) of potassium hydroxide. This mixture was allowed to react by heating under reflux for 4 hours. The product was extracted with 100 mL of chloroform. The chloroform layer was washed with an aqueous sodium hydrogencarbonate solution and distilled water, and dried over anhydrous magnesium sulfate. The chloroform was evaporated off to obtain a product. The obtained product was purified by silica-gel column chromatography (solvent: hexane). Thus the compound represented by Formula 2 below (p-octyloxyphenylacetylene) was isolated at a yield of 69%.

Figure 14:
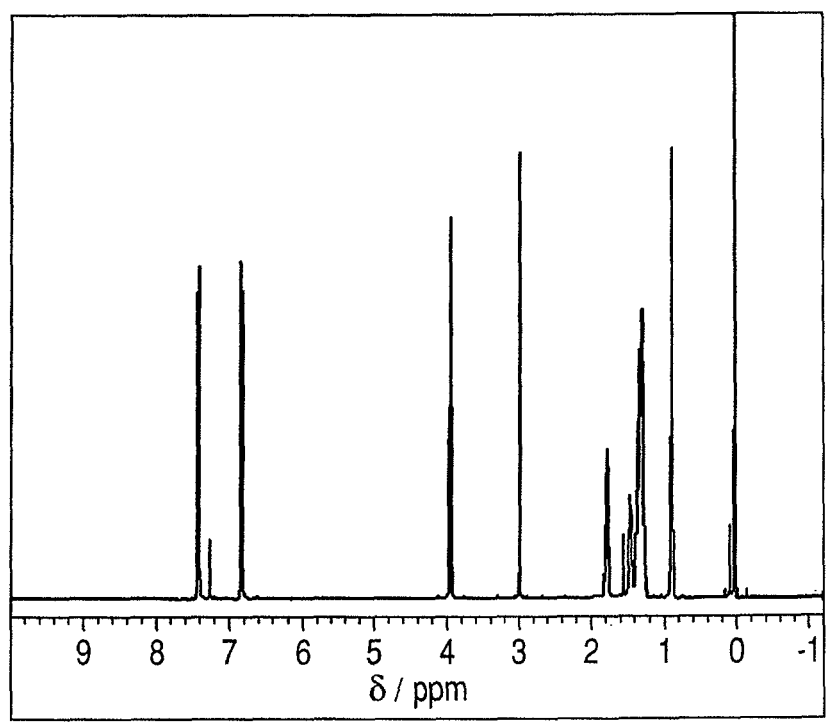
FIG. 14 illustrates 1H-NMR spectrum of p-octyloxyphenylacetylene prepared in Example 1.

The structure of the obtained compound was confirmed by 1H-NMR spectroscopy. The 1H-NMR spectrum data is shown below. FIG. 14 is the 1H-NMR chart thereof.

1H-NMR (standard: TMS, solvent: $CDCl_3$) δ (ppm): 0.9 (triplet, 3H —$CH_3$), 1.3 (multiplet, 8H —$(CH_2)_4$—$CH_3$), 1.5 (quintet, 2H =O—$(CH_2)_2$—$CH_2$—), 1.8 (quintet, 2H —O—$CH_2$—$CH_2$—), 3.0 (singlet, 1H —C≡CH), 4.0 (triplet, 2H —O—$CH_2$—), 6.8 (doublet, 2H phenyl), 7.4 (doublet, 2H phenyl)

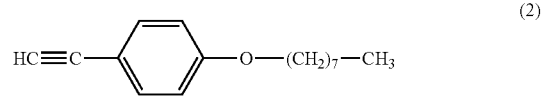

(2)

(Polymerization of the Monomer)

Figure 15:
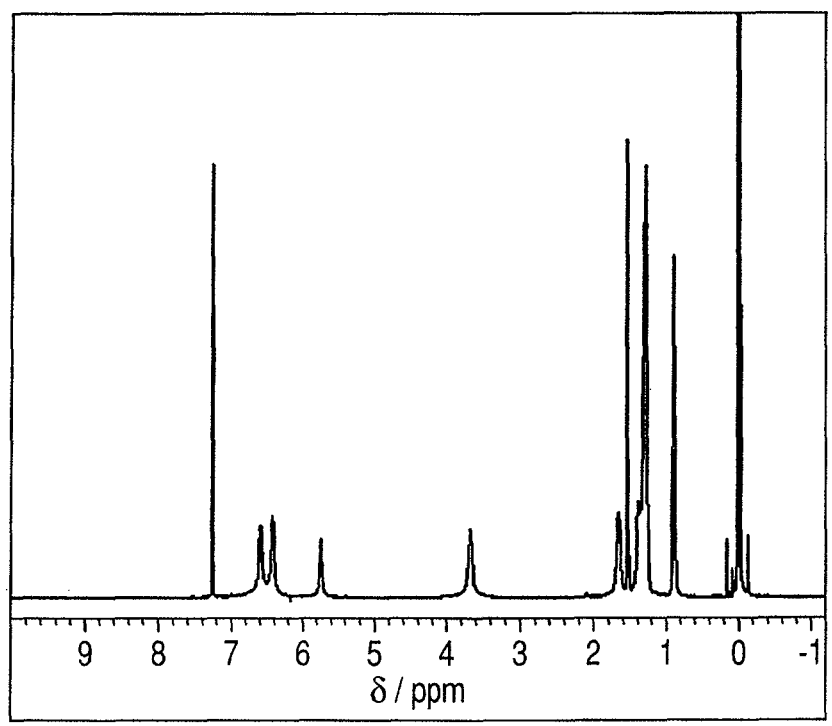
FIG. 15 illustrates 1H-NMR spectrum of poly(p-octyloxyphenylacetylene) prepared in Example 1.

In a test tube, were placed 6.0 mg of rhodium(norbornadiene)chloride dimer, 110 mg of triethylamine, and 3.3 mL of ethanol. Thereto, a mixture of 0.3 g of the compound of Formula 2 (p-octyloxyphenylacetylene) synthesized above and 3.3 mL of ethanol was injected by a syringe to start polymerization reaction. The reaction was allowed to proceed at 20° C. for two hours. The precipitated polymer was washed with methanol, and vacuum-dried to obtain the intended polymer product at a yield of 90%. The obtained polymer had a number-average molecular weight (Mn) of $2.9 \times 10^5$, and a molecular weight distribution (Mw/Mn) of 2.0. The structure of the obtained polymer was confirmed by 1H-NMR spectroscopy. The 1H-NMR spectrum data in deutro-chloroform is shown below. FIG. 15 is the 1H-NMR chart thereof.

1H-NMR (standard: TMS, solvent: $CDCl_3$) δ (ppm): 0.9 (broad, 3H —O—$(CH_2)_7$—$CH_3$), 1.3 (broad, 8H, —(C$H_2)_4$—$CH_3$), 1.4 (broad, 2H =O—$(CH_2)_2$—$CH_2$—), 1.7 (broad, 2H —O—$CH_2$—$CH_2$—), 3.7 (broad, 2H —O—C$H_2$—), 5.8 (singlet, 1H —C≡CH—), 6.5 (broad, 2H phenyl), 6.6 (broad, 2H phenyl)
(Device Production)

The poly(p-octyloxyphenylacetylene) obtained above is applied to bridge the electrodes to produce a device.

Figure 12:
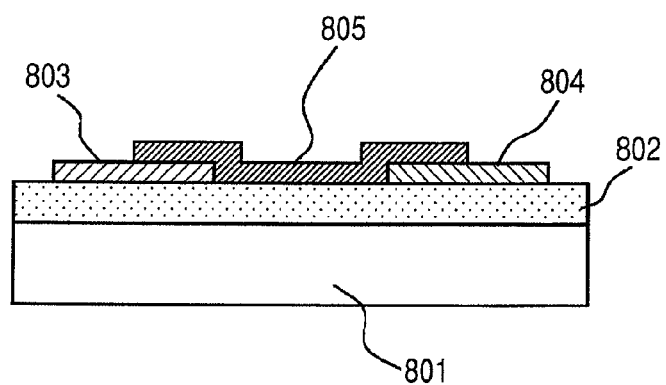
FIG. 12 illustrates an organic device of Example 1 of the present invention.

FIG. 12 illustrates the constitution of the device of this Example. The device of this Example is formed on thermally-oxidized layer 802 of 300 nm thick of highly-doped Si substrate 801. Au electrodes 803, 804 are formed by lithography with an electron beam at an electrode distance of about 50 nm. Separately, 1.0 mg of the poly(p-octyloxyphenylacetylene) obtained above is dissolved in 1.0 mL of chloroform to prepare a solution at a concentration of $1.0 \times 10^{-3}$ wt %. This solution is applied on gold electrodes 803,804 by spin coating to form a thin film 805 of poly(p-octyloxyphenylacetylene). The poly(p-octyloxyphenylacetylene) has an average length of about 100 nm. Therefore many molecules come to connect the both of electrodes 803,804. Thereby, the hopping conduction by molecules between electrodes 803,804 is prevented. The length of the poly(p-octyloxyphenylacetylene) 805 can be measured by AFM.

In this device, Si substrate 801 serves as the gate electrode. The current flowing between electrodes 803,804 is controlled by application of a voltage to the substrate Example 2

Figure 13:
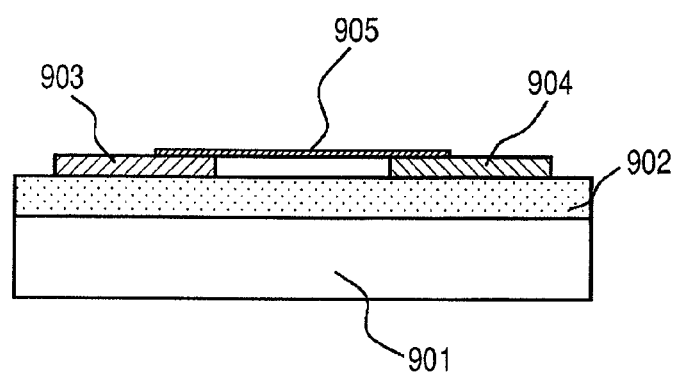
FIG. 13 illustrates an organic device of Example 2 of the present invention.

In this Example 2, a single molecule of the helical substituted polyacetylene bridges two electrodes. FIG. 13 illustrates the constitution of this device. In this Example, only one molecule of the poly(p-octyloxyphenylacetylene) used in Example 1 is placed between electrodes 903,904. This one molecule is denoted by a numeral 905 in FIG. 13. For bridging the electrodes with only one molecule, in one method, the concentration of the poly(p-octyloxyphenylacetylene) is lowered in the spin coating between the electrodes. In another method, the molecule is placed by use of an AFM probe.

In an example of low-concentration application, 0.001 mg of poly(p-octyloxyphenylacetylene) is dissolved in 1.0 mL of chloroform to obtain a concentration of $1.0 \times 10^{-5}$ wt %. This solution is applied on a gold electrode array formed by patterning on a silicon substrate by spin coating. The portion in which just one molecule of the poly(p-octyloxyphenylacetylene) 905 is placed to bridge the electrodes is selected for use as the device. The molecule of the poly(p-octyloxyphenylacetylene) used in this Example has a length of about 100 nm.

Example 3

In the same manner as in Example 1, in a test tube, were placed 11.4 mg of rhodium(norbornadiene) chloride dimer, 208 mg of triethylamine, and 6.2 mL of chloroform. Thereto, a mixture of 0.5 g of the compound of Formula 3 below (2-ethynyl-3-octylthiophene) and 6.2 mL of chloroform was injected by a syringe to start the polymerization reaction. The reaction was allowed to proceed at 30° C. for two hours. The precipitated polymer was washed with methanol, and vacuum-dried to obtain the intended polymer product at a yield of 71%. The obtained polymer had a number-average molecular weight (Mn) of $10.7 \times 10^4$, and a molecular weight distribution (Mw/Mn) of 4.0.

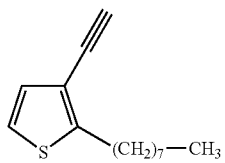

(3)

A 1.0 mg portion of the poly(2-ethynyl-3-octylthiophene) obtained above is dissolved in 1.0 mL of chloroform to prepare a solution at a concentration of $1.0 \times 10^{-3}$ wt %. This solution is applied on gold electrodes by spin coating to produce a device structure.

According to this Example also, a device having the same structure as the one of Example 1 can be produced in the same manner as in Example 1. The structure of the device is the same as that illustrated in FIG. 12 except that poly(2-ethynyl-3-octylthiophene) is used as helical substituted polyacetylene 805. The poly(2-ethynyl-3-octylthiophene) in this Example has an average molecule length of about 70 nm.

Example 4

An organic device was produced by use of poly(p-(2-ethylhexylamido)phenylacetylene.
(Synthesis of Monomer)

In 20 mL of toluene, were dissolved 10 g (40.3 mmol) of p-iodobenzoic acid and 0.15 mL of dimethylformamide. Thereto 7.3 g (61.3 mmol) of thionyl chloride was added to cause reaction with stirring at room temperature for 4 hours. The excess of the thionyl chloride was removed by heating under a reduced pressure. Thereto, a mixture solution of 11.6 g of 2-ethylhexylamine and 7.5 mL of toluene was added and stirred at room temperature for 4 hours to cause a reaction. The reaction product was extracted with 100 mL of chloroform. The chloroform layer was washed with distilled water. The chloroform layer was dried over anhydrous magnesium sulfate. The chloroform was distilled off to obtain the reaction product. The product was purified by column chromatography (solvent: hexane). The product was obtained at an yield of 94%.

A 128 mmol portion of the above product was dissolved in 200 mL of triethylamine. Thereto were added dichlorobis (triphenylphosphine)palladium (II), copper iodide, triphenylphosphine, and tetra(n-butyl)ammonium chloride. The mixture was allowed to react by heating under reflux for three hours. The solvent was distilled off by an evaporator. The reaction product was extracted with 100 mL of chloroform. The chloroform layer was washed with a dilute hydrochloric acid and distilled water, and dried over anhydrous magnesium sulfate. The chloroform was distilled off to obtain the product. The obtained product was purified by column chromatography (solvent: chloroform). The product was isolated at a yield of 69%.

Figure 16:
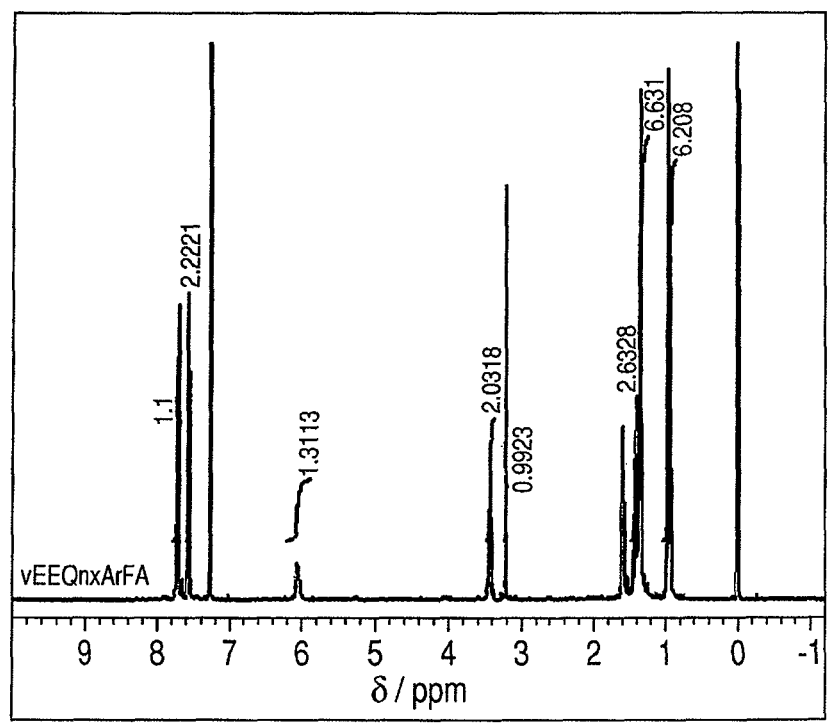
FIG. 16 illustrates 1H-NMR spectrum of p-2-ethylhexylamidophenylacetylene prepared in Example 4.

A portion of 27 g of the obtained product was added to a mixture of 200 mL of ethanol and 4.2 g of potassium hydroxide. This mixture was allowed react by heating under reflux for 4 hours. The product was extracted with 100 mL of chloroform. The chloroform layer was washed with an aqueous sodium hydrogencarbonate and distilled water, and dried over anhydrous magnesium sulfate. The chloroform was distilled off to obtain a product. The obtained product was purified by column chromatography (solvent: hexane). Thus the compound represented by Formula 4 below (p-(2-ethylhexylamido)phenylacetylene) was isolated at a yield of 15%. The structure of the obtained compound was confirmed by 1H-NMR spectroscopy. The 1H-NMR spectrum data in deuterium chloroform is shown below. FIG. 16 is the 1H-NMR chart thereof.

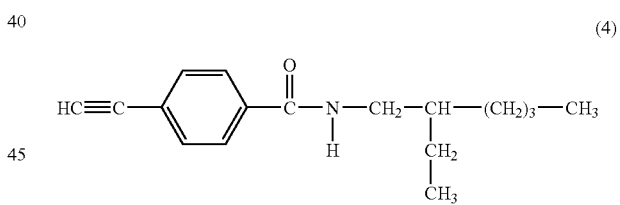

(4)

1H-NMR (standard: TMS, solvent: CDCl$_3$) δ (ppm): 0.9 (triplet, 3H —(CH$_2$)$_3$—CH$_3$), 1.0 (triplet, 3H >CH—CH$_2$—CH$_3$), 1.3 (broad, 8H —CH$_2$—), 1.4 (quintet, 2H —C(O)NH—CH$_2$—CH<), 3.2 (singlet, 1H —C≡CH), 3.4 (triplet, 2H —C(O)NH—CH$_2$—), 6.1 (broad, 1H —C(O)N H—), 7.6 (doublet, 2H phenyl), 7.7 (doublet, 2H phenyl)
(Polymerization of the Monomer)

Figure 17:
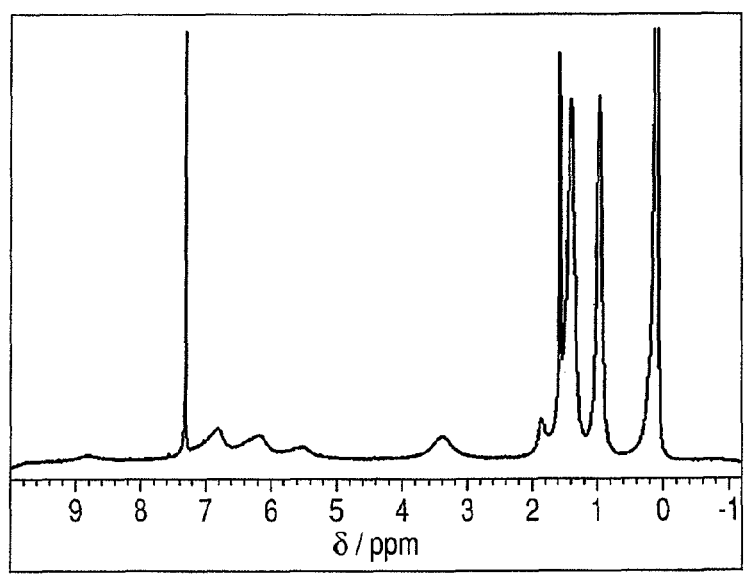
FIG. 17 illustrates 1H-NMR spectrum of poly(p-(2-ethylhexylamido)phenylacetylene) prepared in Example 4.

In a test tube, were placed 13 mg of rhodium(norbornadiene) chloride dimer, 160 mg of triethylamine, and 4.8 mL of chloroform. Thereto, a mixture of 0.5 g of the compound of Formula 4 (p-(2-ethylhexylamido)phenylacetylene) synthesized above and 4.8 mL of chloroform was injected by a syringe to start polymerization reaction. The reaction was allowed to proceed at 30° C. for two hours. The precipitated polymer was washed with methanol, and vacuum-dried to obtain the intended polymer product at a yield of 80%. The obtained polymer had a number-average molecular weight (Mn) of $1.33 \times 10^5$, and a molecular weight distribution (Mw/Mn) of 3.5. The structure of the obtained polymer was confirmed by 1H-NMR spectroscopy. The 1H-NMR spectrum data in deuterated chloroform is shown below. FIG. 17 is the 1H-NMR chart thereof.

1H-NMR (standard: TMS, solvent: CDCl$_3$) δ (ppm): 0.9 (broad, 6H, —CH$_3$), 1.4 (broad, 8H, —CH$_2$—), 1.8 (broad, 1H —C(O)NH—CH$_2$—CH<), 3.4 (broad, 2H —C(O)NH—CH$_2$—), 5.5 (singlet, 1H —C=CH—), 6.2 (broad, 2H phenyl), 6.8 (broad, 2H phenyl), 8.8 (broad, 1H —C(O)NH—)

(Device Production)

The poly(p-(2-ethylhexylamido)phenylacetylene) obtained above was applied between the electrodes to produce a device. The process of device production was the same as in Example 1 except that the obtained poly(p-(2-ethylhexylamido)phenylacetylene) was used. The poly(p-(2-ethylhexylamido)phenylacetylene) had an average length of about 80 nm.

Example 5

A device in which a single polyacetylene molecule bridges electrodes was prepared in the same manner as in Example 2 except that the poly(p-(2-ethylhexylamido)phenylacetylene) was used as the polyacetylene. The poly(p-(2-ethylhexylamido)phenylacetylene) had an average length of about 80 nm.

Example 6

Figure 18:
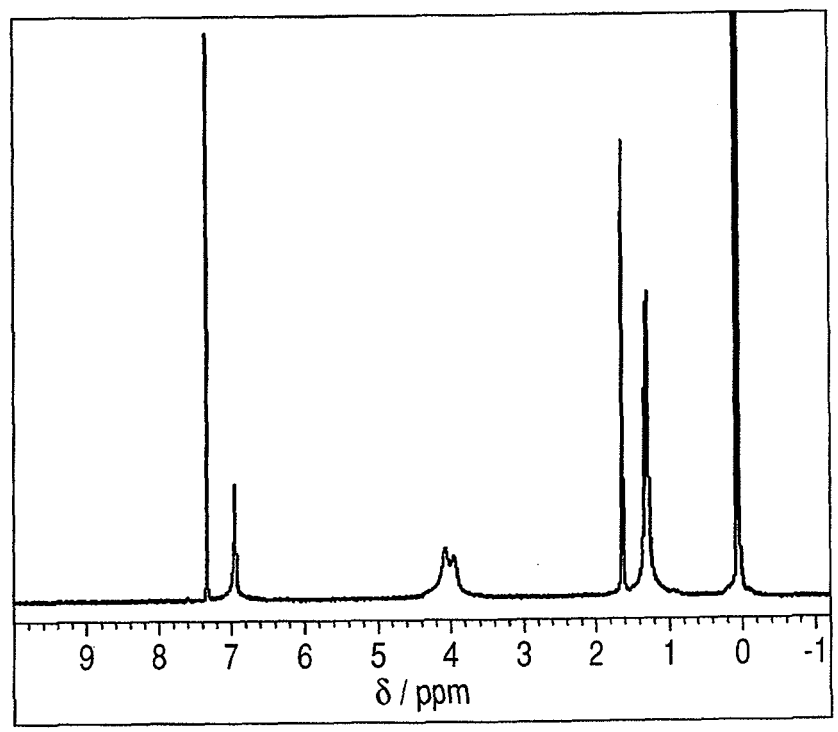
FIG. 18 illustrates 1H-NMR spectrum of polyethyl propiolate prepared in Example 6.

In the same manner as in Example 4, in a test tube, were placed 47 mg of rhodium(norbornadiene) chloride dimer, and 2.6 mL of methanol. Thereto, a mixture of 0.5 g of ethyl propiolate represented by Formula 5 below and 2.5 mL of methanol was injected by a syringe to start polymerization reaction. The reaction was allowed to proceed at 40° C. for 24 hours. The precipitated polymer was washed with methanol, and vacuum-dried to obtain the intended polymer product at a yield of 59%. The obtained polymer had a number-average molecular weight (Mn) of 4.2×10$^4$, and a molecular weight distribution (Mw/Mn) of 6.4 according to GPC measurement. The structure of the obtained polymer was confirmed by 1H-NMR spectroscopy. The 1H-NMR spectrum data in deuterated chloroform is shown below. FIG. 18 is the 1H-NMR chart thereof.

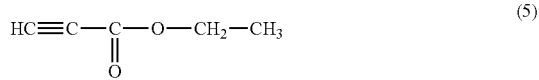

(5)

1H-NMR (standard: TMS, solvent: CDCl$_3$) δ (ppm): 1.3 (broad, 3H —O—CH$_2$—CH$_3$), 3.9-4.0 (broad, 2H, —O—CH$_2$—CH$_3$), 6.9 (singlet, 1H —C=CH—)

A 1.0 mg portion of the poly(ethyl propiolate) obtained above is dissolved in 1.0 mL of chloroform to prepare a solution at a concentration of 1.0×10$^{-3}$ wt %. This solution is applied on gold electrodes patterned on a silicon substrate by spin coating to produce a device structure. In this Example, a device having the same structure as the one of Example 4 can be produced. The poly(ethyl propiolate) employed in this Example has an average length of about 80 nm.

Example 7

Production of Oriented Film (Synthesis of Helical Substituted Polyacetylene)

In a test tube, were placed 47 mg of rhodium(norbornadiene) chloride dimer and 2.6 mL of methanol. Thereto a mixture of 0.5 g of ethyl propiolate and 2.5 mL of methanol was injected to start polymerization reaction. The reaction was allowed to proceed at 40° C. for 24 hours. The precipitated polymer was washed with methanol, and vacuum-dried to obtain the intended polymer product at a yield of 59%. The obtained polymer had a number-average molecular weight (Mn) of 4.2×10$^4$, and a molecular weight distribution (Mw/Mn) of 6.4 according to GPC measurement.

(Production of Oriented Film of Helical Substituted Polyacetylene)

In this Example, an oriented film was produced with a film-forming apparatus, a so-called LB film-forming apparatus, illustrated in FIGS. 19A, 19B and 19C. A portion of 6.56 mg of the poly(ethyl propiolate), a helical polyacetylene (hereinafter referred to as "PEP") was dissolved in 10 mL of chloroform. This solution was dropped onto the surface of ultra-pure water contained in water tank 1901 (40 cm in breadth) with movable barrier 1903 placed at the left end as shown in FIGS. 19A, 19B and 19C. (The ultra-pure water was prepared by an ultra-pure water generation apparatus: Milli-Q SP TOC, Milli-Pore Co.) Then, movable barrier 1903 was moved in the direction of arrow mark 1907 to adjust the film-pressure to 25 mN/m by monitoring with film pressure gauge 1902 to form developed film 1905 of the helical substituted polyacetylene in an area of 2000 cm$^2$ on the water surface.

A substrate 1094 (FIG. 19C) having pairs of opposed electrodes 1908 vapor-deposited thereon was inserted into water tank 1901 to cross developed film 1905 on the water surface and was moved vertically at a movement rate of 0.3 mm/sec to transfer developed film 1905 onto substrate 1904.

Figure 21:
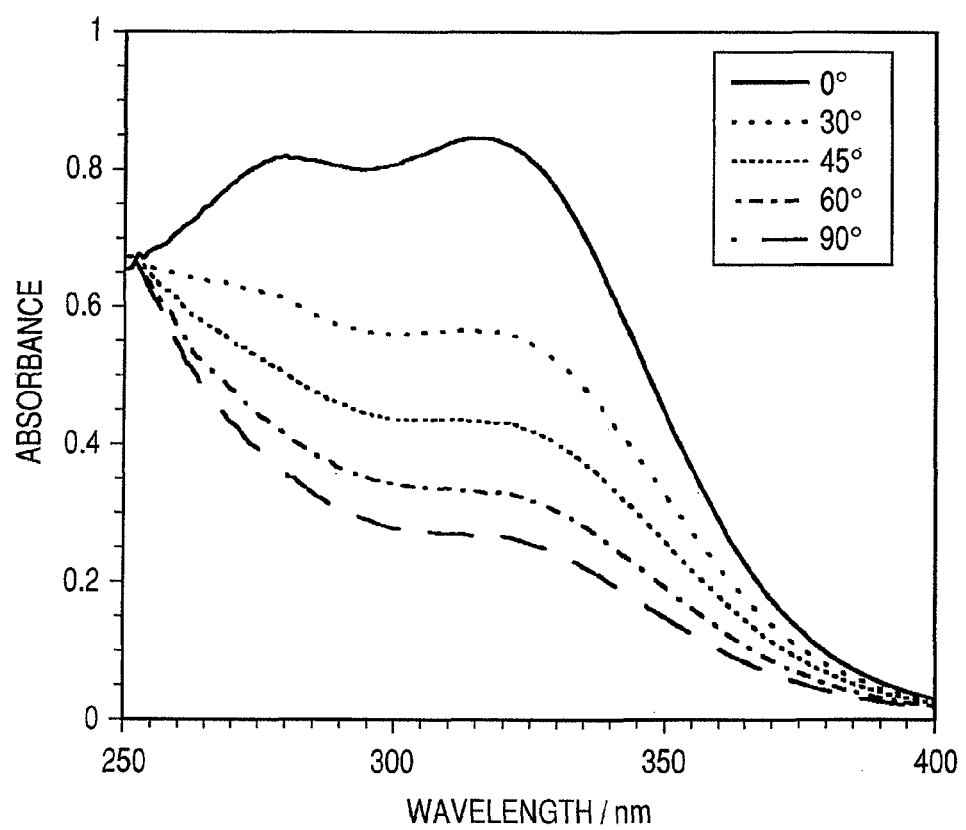
FIG. 21 illustrates UV absorption curves of the built-up film at various polarization angles.

The PEP built-up film formed in 100 layers on the quartz substrate was tested for the dependence of UV absorption spectrum on the light polarization angle. FIG. 21 shows UV absorption curves of the laminated film at the polarization angle from 0° to 90° relative to the vertical movement direction of the substrate.

The absorption peak depends on the material. In FIG. 21, the peak is at 320 nm. A dichroism ratio D represented by the equation below of the film of this Example was 0.53.

$$D=(A-B)/(A+B)$$

where A denotes the absorbance at the polarization direction of the maximum absorption peak, and B denotes the absorbance at the polarization direction of the minimum absorption peak when the polarization direction is varied.

Figure 22:
FIG. 22 is a microphotograph of a built-up film scratched in the direction perpendicular to the substrate movement direction.

A PEP built-up film formed on a glass substrate in the same manner as above was scratched with a needle in the direction perpendicular to the direction of movement of the substrate, and the resulting scar was observed by microscopy (magnification ratio: 50). As the result, around the portion of the film scratched directly with the needle, the film was peeled in a state of a triangle or rhomboid as shown in FIG. 22. (The white arrow mark indicates the direction of pulling-up in the film formation.)

Figure 23:
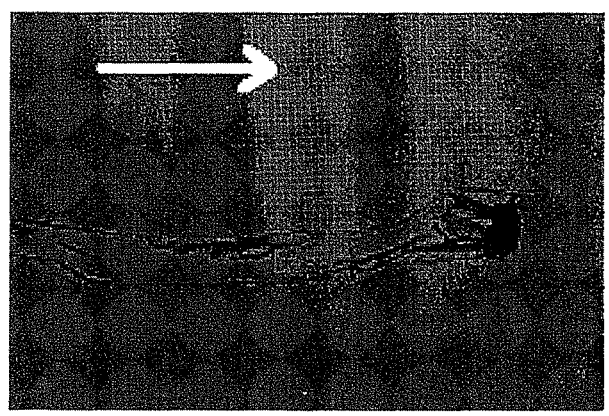
FIG. 23 is a microphotograph of a built-up film scratched in the direction of the substrate movement direction.

Similarly, the built-up film was scratched in the direction of pulling-up of the substrate, and the resulting scar was observed by microscopy (magnification ratio: 50). As the result, only the portion of the film scratched directly with the needle, film was peeled without peeling of the peripheral portion as shown in FIG. 23.

From the above result, the obtained built-up film was confirmed to have long-axis molecules oriented uniaxially perpendicularly to the direction of vertical movement of the substrate.

The direction-dependency of the electroconductivity of the oriented film of the helical substituted polyacetylene was measured in the direction of the vertical movement of the substrate and in the direction perpendicular thereto by bringing a probe needle into contact with the opposing electrode pairs 1908 on glass substrate 1904. Thereby the electroconductivity of the film in the direction of the vertical movement of the substrate was found to be different from that in the direction horizontal to the substrate movement in the film formation.

In particular, the electroconductivity was observed to be improved at the dichroism ratio of 0.1 or more.

(Industrial Availability)

The molecule of the helical substituted polyacetylene which is longer than the distance between the pair of the electrodes makes unnecessary hopping conduction between the polyacetylene molecules in electronic conduction between the electrodes. Therefore the organic device of the present invention is useful for switching elements and transistor elements.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2006-261340, filed Sep. 26, 2006, and No. 2006-261341, filed Sep. 26, 2006 which are hereby incorporated by reference herein in their entirety.

The invention claimed is:

1. A device comprising a structure comprised of a helical substituted polyacetylene having a helical main chain, and a pair of electrodes, wherein a length of a single molecule of the helical substituted polyacetylene is not smaller than the distance between the pair of the electrodes.

2. The device according to claim 1, wherein the structure is composed of a single molecule of the helical substituted polyacetylene.

3. The device according to claim 1, wherein the helical substituted polyacetylene has a non-conjugated functional group in a side chain.

4. The device according to claim 1, wherein the helical substituted polyacetylene has a polar substituent group in a side chain.

5. The device according to claim 1, wherein the device comprises a controlling electrode.

6. The device according to claim 1, wherein a length of each and every single molecule of the helical substituted polyacetylene is not smaller than the distance between the pair of the electrodes.

* * * * *